(12) United States Patent
Flewelling et al.

(10) Patent No.: US 8,179,186 B2
(45) Date of Patent: May 15, 2012

(54) DIFFERENTIAL SWITCH WITH OFF-STATE ISOLATION ENHANCEMENT

(75) Inventors: Gregory M. Flewelling, Merrimack, NH (US); Douglas S. Jansen, Pelham, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 29 days.

(21) Appl. No.: 12/535,596

(22) Filed: Aug. 4, 2009

(65) Prior Publication Data

US 2011/0032022 A1 Feb. 10, 2011

(51) Int. Cl.
*H03K 17/16* (2006.01)
*H03K 17/60* (2006.01)

(52) U.S. Cl. ........ 327/379; 327/365; 327/478; 327/482; 330/252

(58) Field of Classification Search .............. 327/52, 327/89, 359, 389, 563, 365, 379, 478, 482; 330/252–254, 261
See application file for complete search history.

(56) References Cited

U.S. PATENT DOCUMENTS

| | | | |
|---|---|---|---|
| 6,781,434 B2 | 8/2004 | Jensen et al. | |
| 6,946,948 B2 * | 9/2005 | McCormack et al. | 340/2.28 |
| 7,071,858 B2 * | 7/2006 | Pan | 341/133 |
| 7,542,812 B2 | 6/2009 | Stroili et al. | |
| 7,848,724 B2 * | 12/2010 | Bult et al. | 455/252.1 |
| 2002/0130709 A1 | 9/2002 | Teel et al. | |
| 2005/0005296 A1 | 1/2005 | Bargroff et al. | |
| 2005/0285634 A1 | 12/2005 | Doyle et al. | |
| 2006/0006929 A1 | 1/2006 | Caplan et al. | |
| 2006/0092062 A1 | 5/2006 | Pan | |
| 2009/0140777 A1 | 6/2009 | Morisson | |

OTHER PUBLICATIONS

Luh, L.; Choma, J., Jr.; Draper, J.; , "A high-speed fully differential current switch," Circuits and Systems II: Analog and Digital Signal Processing, IEEE Transactions on , vol. 47, No. 4, pp. 358-363, Apr. 2000.*
PCT Search Report and Written Opinion, PCT/US2010/41880, mailed Aug. 31, 2010.
Luh et al, "A High-Speed Fully Differential Current Switch", University of Southern California.

* cited by examiner

*Primary Examiner* — Patrick O'Neill
(74) *Attorney, Agent, or Firm* — Finch & Maloney PLLC; Neil F. Maloney

(57) ABSTRACT

Techniques are disclosed for reducing off-state leakage current in a differential switching device. The techniques can be embodied, for example, in a method that includes receiving a differential input signal at a differential input of each of a primary switch and a dummy switch. In an enabled-state of the device, the method further includes passing the differential input signal to a differential output of the primary switch. In a disabled-state of the device, the method further includes canceling off-state leakage current at the differential output of the primary switch, by virtue of the dummy switch having its differential output reverse-coupled to the differential output of the primary switch. The method may further include preventing the dummy switch from passing signals other than off-state leakage signals. The techniques can be embodied, for instance, in a switching device.

20 Claims, 3 Drawing Sheets

_US 8,179,186 B2_

DIFFERENTIAL SWITCH WITH OFF-STATE ISOLATION ENHANCEMENT

STATEMENT OF GOVERNMENT INTEREST

The invention was made with United States Government support under contract W15P7T-06-C-P635 awarded by the Army, and the United States Government may have certain rights in this invention.

FIELD OF THE INVENTION

The invention relates to electronic switches, and more particularly, to techniques for reducing switch leakage during the disabled-state of differential switches.

BACKGROUND OF THE INVENTION

A differential switch is commonly implemented using a differential pair of transistors, which have their emitters coupled together to a current source. The differential input to the switch is provided to the bases of the transistor pair, and the differential output is taken at the corresponding collectors. When the differential switch is enabled (current source is enabled), the differential pair inverts the signal applied to the bases, such that a positive going base signal causes a negative going collector signal (and vice versa, where a negative going base signal causes a positive going collector signal). Further note that, when the differential switch is enabled, both transistors of the differential pair will have current flowing through them continuously (assuming linear operation). The ratio of transistor currents (e.g., transistors Q1 and Q2, which make up the differential pair) will generally vary as a function of the applied differential input signal. When the differential switch is disabled (current source is disabled), both transistors of the differential pair are off (not conducting).

The current source is typically implemented with a third transistor, which has a constant bias voltage applied to its base. In operation, the differential switch is effectively controlled by the sign of the differential control signal applied to the bases of the differential pair. In more detail, energy from the current source passes through one transistor of the differential pair (e.g., the transistor having the higher base potential), and the corresponding output signal is provided at the collector of that transistor. The complement of this output signal is the output signal provided at the collector of the other transistor of the differential pair (e.g., the transistor having the lower base potential), thereby providing a differential output.

There are a number of ways to implement a conventional differential switch, whether by simple series switching or series-shunt switching techniques. In any such cases, a common problem associated with the switch is leakage. In particular, signal leakage though the series switching device degrades off-state isolation (i.e., when the switch is disabled, it still passes the output signal being applied at the inputs), especially at high frequencies.

There is a need, therefore, for differential switching devices having better leakage performance.

SUMMARY OF THE INVENTION

One embodiment of the present invention provides a method for reducing off-state leakage current in a differential switching device. The method includes receiving a differential input signal at a differential input of each of a primary switch and a dummy switch. In an enabled-state of the device, the method further includes passing the differential input signal to a differential output of the primary switch. In a disabled-state of the device, the method further includes canceling off-state leakage current at the differential output of the primary switch, by virtue of the dummy switch having its differential output reverse-coupled to the differential output of the primary switch. The method may include preventing the dummy switch from passing signals other than off-state leakage signals. In one such particular case, preventing the dummy switch from passing signals other than off-state leakage signals is achieved using a current source that is set to zero and operatively coupled to the dummy switch. In another such case, preventing the dummy switch from passing signals other than off-state leakage signals is achieved by disabling the dummy switch during on-state functioning of the primary switch.

Another embodiment of the present invention provides a differential switching device for reducing off-state leakage current. The device includes a primary switch having a differential input, and for receiving a differential input signal at its differential input, wherein in an enabled-state of the device, the differential input signal is passed to a differential output of the primary switch. The device further includes a dummy switch having a differential input, and for receiving the differential input signal at its differential input, wherein in a disabled-state, off-state leakage current is cancelled at the differential output of the primary switch, by virtue of the dummy switch having its differential output reverse-coupled to the differential output of the primary switch. In one particular case, the dummy switch is prevented from passing signals other than off-state leakage signals. In one such case, the dummy switch is prevented from passing signals other than off-state leakage signals by using a current source that is set to zero and operatively coupled to the dummy switch. In another such case, the dummy switch is prevented from passing signals other than off-state leakage signals by disabling the dummy switch during on-state functioning of the primary switch. In another particular case, the primary and dummy switches may be identically constructed, and/or each includes a differential pair of transistors. In one such case, the differential pair of transistors associated with the primary switch is operatively coupled to a primary current source. The primary current source may be controllable by a control signal. In another such case, the differential pair of transistors associated with the dummy switch is operatively coupled to a dummy current source. In another particular case, the dummy current source is always disabled. The device may be included, for example, in a system-on-chip configuration. The device may be included, for instance, in a crossbar switch matrix.

Any number of variations will be apparent in light of this disclosure. For instance, another embodiment of the present invention provides a differential switching device for reducing off-state leakage current. In this example case, the device includes a primary switch having a differential input and a first differential pair of transistors, and for receiving a differential input signal at its differential input, and the first differential pair of transistors is operatively coupled to a primary current source that is controllable by a control signal, and wherein in an enabled-state of the device, the differential input signal is passed to a differential output of the primary switch. The device further includes a dummy switch having a differential input and a second differential pair of transistors, and for receiving the differential input signal at its differential input, and the second differential pair of transistors is operatively coupled to a dummy current source, wherein in a disabled-state, off-state leakage current is cancelled at the differential output of the primary switch, by virtue of the dummy switch having its differential output reverse-coupled to the differential output of the primary switch, and wherein the dummy switch is prevented from passing signals other than off-state leakage signals. In one such case, the dummy switch is prevented from passing signals other than off-state leakage signals by setting the dummy current source to zero. In another such case, the dummy switch is prevented from passing signals other than off-state leakage signals by disabling the dummy switch during on-state functioning of the primary switch. In another such case, the dummy current source is always disabled. In another such case, the device is included in a system-on-chip configuration.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Figure 1:
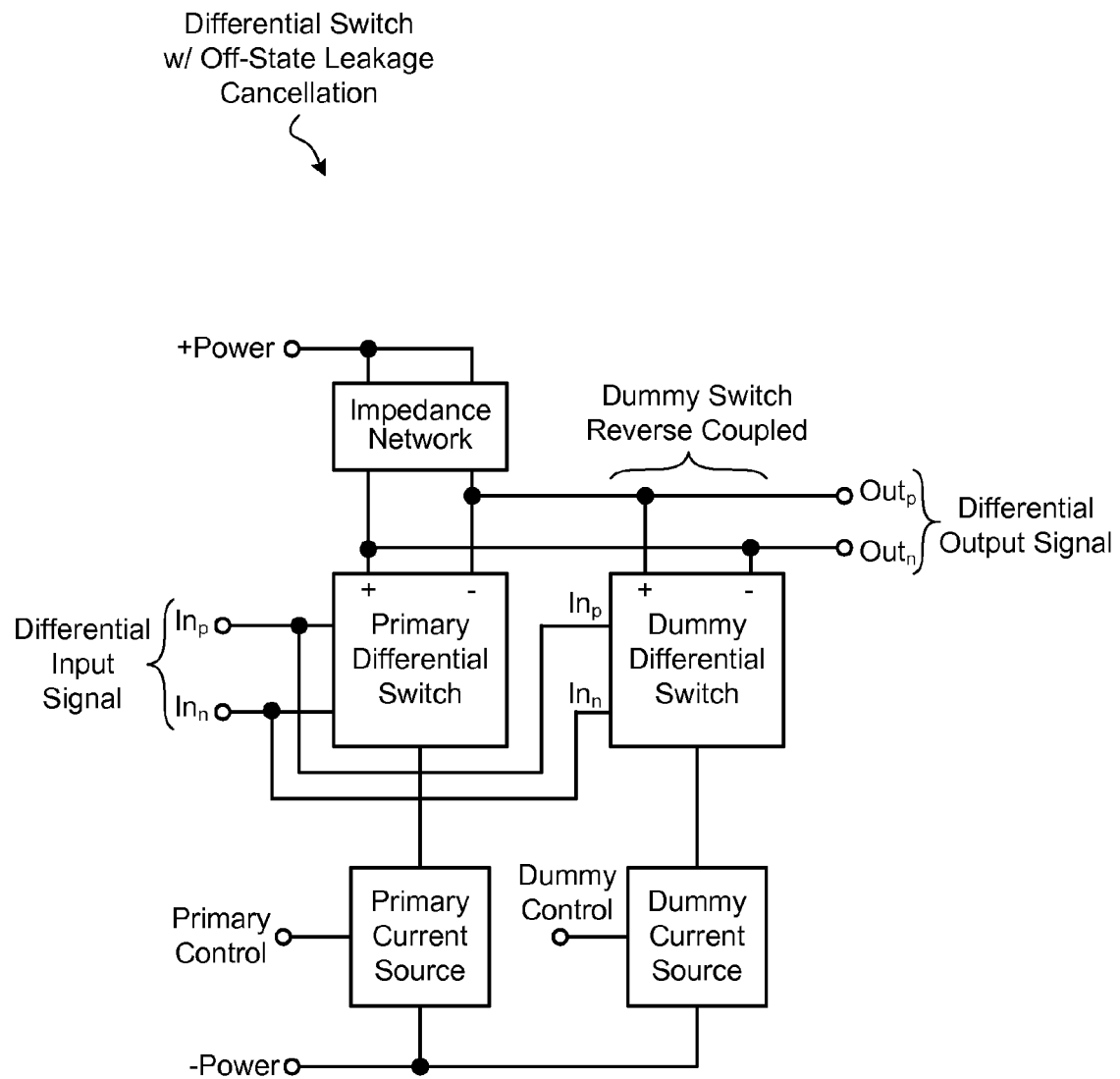
FIG. 1 is a block diagram of a differential switching device configured in accordance with one embodiment of the present invention.

A differential switching device is disclosed that eliminates or otherwise significantly reduces switch leakage during the switch disabled-state. The switching technique can be implemented in any number of applications, including integrated system-on-chip configurations as well as printed circuit boards configured with various discrete components including differential switches. The frequency range of the switch (e.g., RF, microwave, etc) will depend on the particular application at hand, as will be appreciated in light of this disclosure.

General Overview

A differential switch is commonly implemented using a differential pair of transistors, which have their emitters coupled together to a current source. The differential input is provided to the bases of the transistor pair, and the differential output is taken at the corresponding collectors. When the differential switch is enabled (current source is enabled), the differential pair inverts the signal applied to the bases, such that a positive going base signal causes a negative going collector signal (and vice versa, where a negative going base signal causes a positive going collector signal). Further note that, when the differential switch is enabled, both transistors of the differential pair will have current flowing through them continuously (assuming linear operation). The ratio of transistor currents (e.g., Q1 and Q2) will generally vary as a function of the applied differential input signal. When the differential switch is disabled (current source is disabled), both transistors of the differential pair are off (not conducting).

The current source can be implemented in a variety of ways, for instance, with a third transistor, which has a constant bias voltage applied to its base. In operation, the switch is effectively controlled by the sign of the differential control signal applied to the bases of the differential pair. In more detail, energy from the current source passes through one transistor of the differential pair (e.g., the transistor having the higher base potential), and the corresponding output signal is provided at the collector of that on transistor. The complement of this output signal is the output signal provided at the collector of the other transistor of the differential pair (e.g., the transistor having the lower base potential), thereby providing a differential output.

As previously mentioned, a common problem associated with the conventional switch topology is that signal leakage though the switching device degrades off-state isolation. This problem is exacerbated as frequency of the signal being switch increases. As such, and in accordance with an embodiment of the present invention, the topology of the primary differential switch can be further configured with a differential reverse-coupled dummy switch that is operatively coupled across the primary switch. This differential reverse-coupled configuration allows leakage signals through disabled primary and dummy switches to cancel, thereby decreasing off-state leakage.

Thus, by providing a secondary path of leakage signal that is 180 degrees out of phase from the primary path and summing these two leakage paths together, a high degree of leakage cancellation can be achieved. This reduces the net leakage through a disabled differential switch. This in turn improves the isolation ratio of the switch, which is the ratio (usually expressed in decibels) of the applied signal output with the switch enabled to the switch disabled. A conventional switch (i.e., without the reverse-coupled dummy switch) might achieve, for instance, only a 20 dB ratio at 6 GHz. In contrast, a differential switch configured with a dummy switch as described herein, can achieve, for instance, a 50 dB ratio at 6 GHz.

As will be appreciated in light of this disclosure, the techniques described herein have particular significance for analog signals, especially high-frequency RF signals. In such applications, it is generally desirable that the transistors making up a differential pair stay in linear mode, which means when one transistor turns on a little more, the other transistor turns on a little less (with differential symmetry). Thus, the transistors can actually both be on, but one is conducting more than the other. In addition, the differential switching device itself can be in an enabled-state (where at least one of the transistors in a differential pair of the device is intentionally conducting) or a disabled-state (where no transistors are intentionally conducting).

Switch Architecture

FIG. 1 is a block diagram of a differential switching device configured in accordance with one embodiment of the present invention.

As can be seen, the device includes a primary differential switch and a dummy differential switch, which are operatively coupled to one another. In particular, the differential input signal ($In_p$ and $In_n$) is applied to the differential inputs of each of the primary and dummy switches. In addition, the differential output of the primary switch is reverse-coupled to the differential output of the dummy switch. The resulting differential output signal is designated at $Out_p$ and $Out_n$. The dummy switch is identically constructed to the primary switch.

An impedance network connected between the positive power supply (+Power) and the differential output of each switch effectively sets the gain through the device. In addition, a primary current source is connected between the negative power supply (−Power) of the primary switch, and a dummy current source is connected between the negative power supply of the dummy switch. The primary and dummy current sources effectively control current flow through each of the primary and dummy switches, respectively. In operation, the primary current source is controlled as needed (via the Primary Control signal) to provide desired current, while the dummy current source is set to zero (via the Dummy Control signal) such that no current flows through the dummy switch. By setting the dummy switch current flow to zero, only undesired signals such as leakage are cancelled, while intentional signals are not.

In the enabled-state of the device, the primary switch provides a gain based on the impedance network. The gain may be, for example, 1 or higher for applications calling for unity gain or amplification. Alternatively, the gain may be less than 1 for applications calling for attenuation. Since the dummy current source is set to or otherwise configured at zero, the gain through the dummy switch is also zero. Thus, the device gain is only controlled by the primary switch.

In the disabled-state of the device, both the primary and dummy current sources are zero. This means that the gain through each of the primary and dummy switches is zero. In this case, the leakage through the primary and dummy switches has to be considered. In general, there may be leakage current from the switch inputs to their respective outputs. This leakage is typically due to factors such as capacitive coupling across the base-collector junctions (or gate-drain junctions for FETs). Therefore, as frequency increases the leakage may also increase (i.e., reactance of the capacitive coupling decreases as frequency increases).

In a conventional switch device, such leakage would appear as a signal on the differential output of the disabled device, effectively reducing the off-isolation of the device at higher frequencies. In accordance with embodiments of the present invention, however, the leakage through the primary switch and the leakage through the dummy switch are essentially identical in magnitude and phase (because the dummy switch is identically constructed to the primary switch). As such, by reverse-coupling the differential output of the primary switch with the differential output of the dummy switch, the leakages cancel each other out thereby providing a net differential signal between $Out_p$ and $Out_n$ of zero, when the device is disabled. This identical construction of the primary and dummy switches and reverse-coupling of their respective differential outputs greatly increases the off-isolation.

Figure 2:
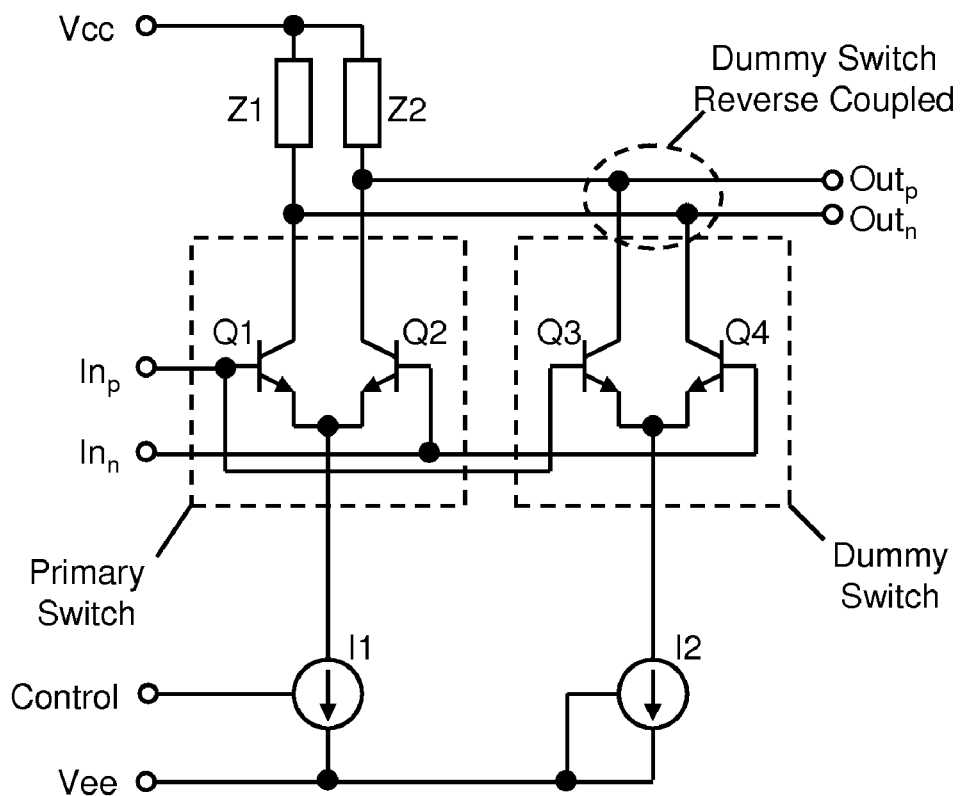
FIG. 2 is a schematic diagram of a differential switching device configured in accordance with one embodiment of the present invention.

FIG. 2 is a schematic diagram of a differential switching device configured in accordance with one embodiment of the present invention.

As can be seen, the device in this example configuration includes a primary switch and a dummy switch, each of which are implemented with a differential pair of bipolar junction transistors. In particular, the primary switch includes transistors Q1 and Q2, and the dummy switch includes transistors Q3 and Q4. Other embodiments may employ, for instance, field effect transistors or any other suitable transistor technology. The differential input signal is applied to the differential inputs of each of the primary and dummy switches, where $In_p$ is provided to the base of Q1 and Q3, and $In_n$ is provided to the base of Q2 and Q4.

As explained herein, since the dummy switch is identically constructed to the primary switch, the reverse-coupled leakage signal of the dummy switch is equal in amplitude (but 180° out of phase) to primary leakage signal and thus cancels. Note that 'identical' as used herein implies that the primary and dummy switches are matched or otherwise constructed to provide (in response to a common stimulus) leakage signals that are sufficiently similar in phase and amplitude, such that when those leakage signals are reverse-coupled to one another, the resulting signal has a magnitude of zero (within an acceptable tolerance for the given application). Thus, the identically constructed switches may generate leakage signals not precisely equal. For instance, in one example case, the leakage signals may be within +/−10% of one another. The degree of identicalness will depend on the demands of the application at hand.

Matching load impedances Z1 and Z2 are connected between the positive power supply (Vcc) and the collectors of Q1 through Q4. In addition, a primary current source I1 is connected between the negative power supply (Vee) and the emitters of Q1 and Q2, and a dummy current source I2 is connected between the negative power supply and the emitters of Q3 and Q4. As will be appreciated, the voltage value of Vcc and Vee will vary depending on the particular application at hand. Typical values for Vcc are in the range of 2 VDC to 20 VDC (e.g., 5 VDC), and typical values for Vee are in the range of −20 VDC to 0 VDC (e.g., −5 VDC).

The current sources I1 and I2 effectively control current flow through each of the primary and dummy switches, respectively. In operation, the primary current source I1 is controlled as needed (via the Control signal) to provide desired current, while the dummy current source I2 is disabled (or otherwise set to zero) such that no current flows through the dummy switch. As previously explained, by setting the dummy switch current flow to zero, only undesired signals during the off-state such as leakage are cancelled, while intentional signals are not.

As will be appreciated in light of this disclosure, the primary and dummy switches can be implemented with any type of transistors, whether discrete on a printed circuit board or integrated on an integrated circuit chip or chip set. In one specific example embodiment, transistors Q1-Q4 are implemented in a system-on-chip configuration using standard CMOS processes. Other suitable switching elements (e.g., FET, HEMT, or any type of bipolar device) may be used. The load impedances Z1-Z2 can be, for instance, any type of passive or active structure, and in one example are implemented as thin film resistors within a CMOS process used to make transistors Q1-Q4.

The current sources I1-I2 can also be passive or active. In any such cases, current source I1 can be switched on to turn the primary switch on, and switched off to turn the primary switch off. The control signal for the current source I1 can be provided, for example, on-chip (e.g., via a processor programmed or otherwise configured to control current source I1 in a manner that is responsive to a set of conditions) or similarly controlled remotely from an external control circuit. In one specific embodiment, current source I2 is always disabled or otherwise off. Alternatively, it can be switched according to a switching scheme, as with current source I1. Each of the current sources I1 and I2 can be implemented, for example, with a thin film resistor and a switch (e.g., CMOS FET, HEMT, or BJT similar to those used in differential pairs of the primary and dummy switches), or a discrete switched reference generator. The actual implementation of components making up the differential switching device will depend on various factors such as implementation cost constraints and the desired form factor of the switching device, as well as the gain and frequency of operation of the device.

In the enabled-state of the device, the transistors Q1 and Q2 act as a differential pair providing gain equal to the transconductance of transistors Q1 and Q2 times the load impedances Z1 and Z2. In more detail, given the nature of a differentially balanced circuit, Z1 equals Z2, and therefore the gain through the primary switch equals: gm*Z1, or gm*Z2. This gain can also be computed as: (I1/Vt)*Z1, or (I1/Vt)*Z2, where Vt is the thermal voltage, which is approximately 0.0259V at room temperature for silicon, for example. In a similar fashion, the transistors Q3 and Q4 act as a differential pair, the gain of which can be computed as: (−1*I2)/(Vt*Z1) or (−1*I2)/(Vt*Z2). In this case, the gain is negative because the outputs are reversed relative to the outputs of transistors Q1 and Q2. Since current source I2 is zero, the gain through transistors Q3 and Q4 will also be zero. As such, the switch gain through the differential switching device is only due to transistors Q1 and Q2. For example, assume impedances Z1 and Z2 are each 50 ohms and current source I1 is 1 mA. In such a configuration, the gain through the differential switching device is 1 mA/0.0259V*50=1.93.

In the disabled-state of the device, both current sources I1 and I2 are zero. This means that the transconductance is zero and therefore the first order gain is zero. In such a case, the leakage through the off transistors has to be considered. In particular, there may be leakage from the inputs (at each base, in the example shown) of the four transistors Q1-Q4 to their respective outputs (at each collector, in the example shown). This is due, for instance, to capacitive coupling across the base-collector junctions (or gate-drain junctions for FETs). Therefore, as frequency increases, the impedance through those capacitive junctions decreases, thereby causing leakage to increase. In a conventional differential switching device, this leakage would appear as a signal on $Out_p$ and $Out_n$, effectively reducing the off-isolation of the device at higher frequencies. In accordance with an embodiment of the present invention, however, the leakage through transistor Q1 and the leakage through transistor Q3 are essentially identical in magnitude and phase, likewise for transistors Q2 and Q4 (given the identical construction of the primary and dummy switches of the device). Since transistors Q1 and Q4 are connected to $Out_n$, and transistors Q2 and Q3 are connected to $Out_p$, these leakages cancel each other out leading to a net differential signal between $Out_p$ and $Out_n$ of zero. This cancellation significantly increases the off-isolation of the device.

Such a differential switching device as shown in FIG. 1 or 2 can be used in any number of switching applications. One such example application is in a crossbar switch matrix arrangement, which includes a plurality of the devices operatively coupled to one another. For instance, the differential output of each device is connected with the differential output of other devices, and the differential input of each device is connected with the differential input of the other devices, thereby forming an array. The array can have N inputs and M outputs (N need not equal M, but may if so desired), and any one of the N inputs can be mapped to any one of the M outputs. Thus, any one of the inputs can be switched to any one or more of the outputs. Such a crossbar switch matrix configuration is commonly called a one-to-many mapping. Other applications that can benefit from the differential switching devices described herein will be apparent.

Methodology

Figure 3:
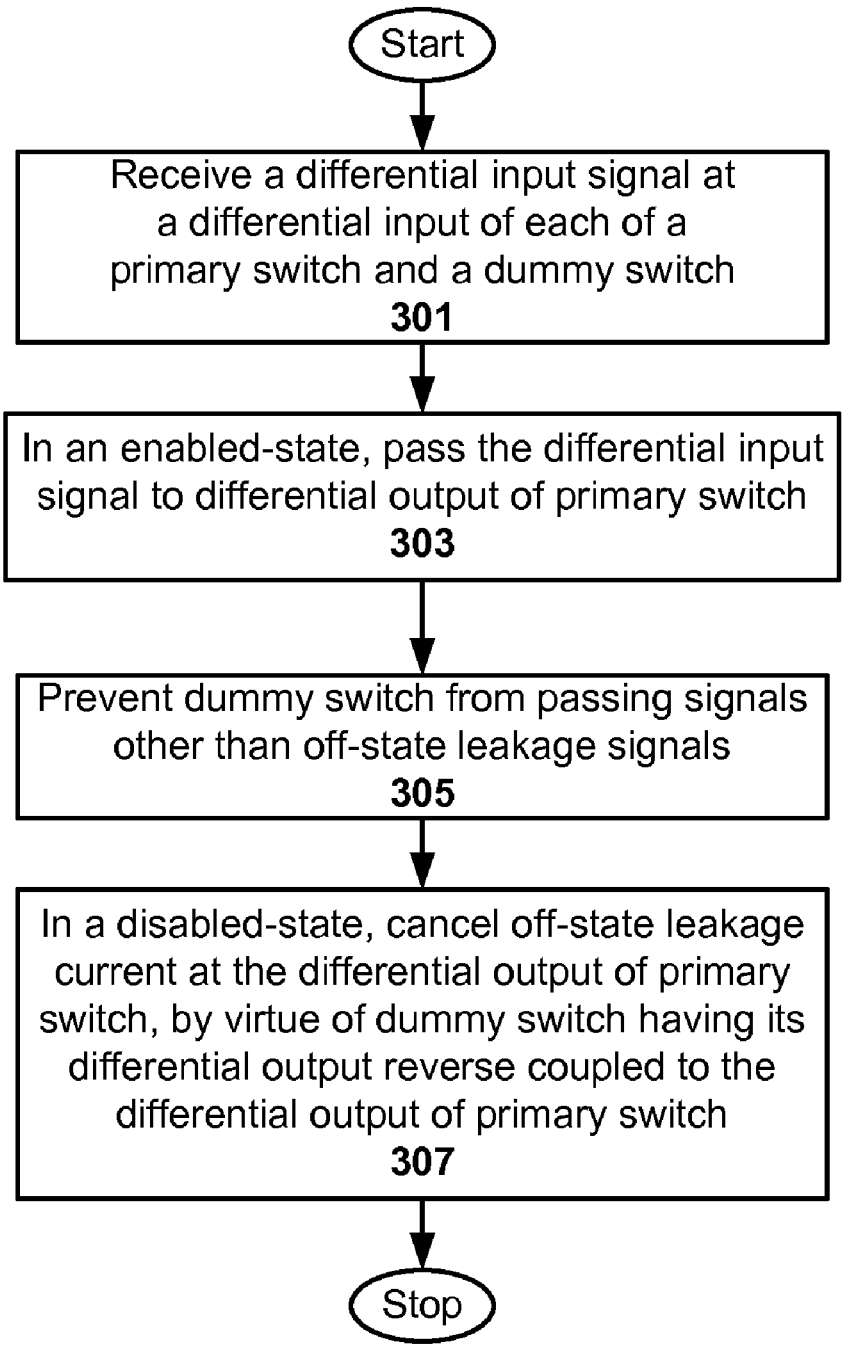
FIG. 3 illustrates a method for reducing off-state leakage current in a differential switching device, in accordance with one embodiment of the present invention.

FIG. 3 illustrates a method for reducing off-state leakage current in a differential switching device, in accordance with one embodiment of the present invention. The method can be carried out, for example, by the differential switching devices shown in FIGS. 1 and 2.

The method includes receiving 301 a differential input signal at a differential input of each of a primary switch and a dummy switch. In an enabled-state of the device (where the device is effectively in its on-state), the method may further include passing 303 the differential input signal to a differential output of the primary switch. The differential input signal can be any signal suitable for a given application, and its various parameters (e.g., frequency, power, etc) will vary from one application to the next.

The method further includes preventing 305 the dummy switch from passing signals other than off-state leakage signals. As explained herein, this can be achieved, for instance, by setting a current source operatively coupled to the dummy switch to zero. Alternatively, the dummy switch can be disabled during on-state functioning of the primary switch. This disablement can be in the form of one or more disable switches that effectively disconnect the differential output of the dummy switch from the differential output of the primary switch. In such cases, when the state of the primary switch changes from on (device is in enabled-state) to off (device is in disabled-state), the disablement can be released, such that the differential output of the dummy switch is connected back to the differential output of the primary switch. Any number of disablement schemes can be used here.

In a disabled-state of the device (where the device is effectively in its off-state), the method further includes canceling 307 off-state leakage current at the differential output of the primary switch, by virtue of the dummy switch having its differential output reverse-coupled to the differential output of the primary switch. As previously explained, by reverse-coupling the differential output of the dummy switch and properly controlling its current flow, only undesired signals such as leakage are cancelled, while intentional signals are not.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for reducing off-state leakage current in a differential switching device, the method comprising:
receiving an analog differential input signal at a differential input of the differential switching device, the differential input being coupled to each of a primary switch and a dummy switch, wherein each of the primary and dummy switches includes a differential pair of transistors and the analog differential input signal is applied to the bases or gates of the transistors;
in an enabled-state of the differential switching device, passing the analog differential input signal to a differential output of the primary switch, wherein in the enabled-state both transistors of the primary switch differential pair intentionally conduct at the same time at least part of the time but one transistor of the pair conducts more than the other transistor;
preventing the dummy switch from passing signals other than off-state leakage signals using a dummy current source operatively coupled to the dummy switch and set so that no intentional current flows through the dummy switch, wherein neither transistor of the dummy switch differential pair intentionally conducts; and
in a disabled-state of the differential switching device during which a primary current source operatively coupled to the primary switch is set so that no intentional current flows through the primary switch, canceling off-state leakage current at a differential output of the differential switching device, by virtue of the differential output of the primary switch being coupled to the differential output of the differential switching device and the dummy switch having its differential output reverse-coupled to the differential output of the primary switch, wherein in the disabled-state neither transistor of the primary switch differential pair intentionally conducts.

2. The method of claim 1 wherein preventing the dummy switch from passing signals other than off-state leakage signals comprises disabling the dummy current source.

3. The method of claim 1 wherein preventing the dummy switch from passing signals other than off-state leakage signals is achieved by setting the dummy current source to zero.

4. The method of claim 1 wherein preventing the dummy switch from passing signals other than off-state leakage signals is achieved by disabling the dummy switch only during on-state functioning of the primary switch.

5. A differential switching device, comprising:
a differential input for receiving an analog differential input signal;
a primary switch coupled to the differential input and for receiving the analog differential input signal, the primary switch including a differential pair of transistors and the differential input being coupled to the bases or gates of those transistors, wherein in an enabled-state of the differential switching device, the analog differential input signal is passed to a differential output of the primary switch, wherein in the enabled-state both transistors of the primary switch differential pair intentionally conduct at the same time at least part of the time but one transistor of the pair conducts more than the other transistor;
a dummy switch coupled to the differential input and for receiving the analog differential input signal, the dummy switch including a differential pair of transistors and the differential input being coupled to the bases or gates of those transistors, wherein in a disabled-state of the differential switching device, off-state leakage current is cancelled at a differential output of the differential switching device, by virtue of the differential output of the primary switch being coupled to the differential output of the differential switching device and the dummy switch having its differential output reverse-coupled to the differential output of the primary switch;
a primary current source operatively coupled to the primary switch and set so that no intentional current flows through the primary switch during the disabled-state of the differential switching device, wherein in the disabled-state neither transistor of the primary switch differential pair intentionally conducts; and
a dummy current source operatively coupled to the dummy switch and set so that no intentional current flows through the dummy switch during either of the enabled-state of the differential switching device or the disabled-state of the differential switching device, wherein neither transistor of the dummy switch differential pair intentionally conducts.

6. The device of claim 5 wherein the dummy switch is prevented from passing signals other than off-state leakage signals by disabling the dummy current source.

7. The device of claim 5 wherein the dummy switch is prevented from passing signals other than off-state leakage signals by setting the dummy current source to zero.

8. The device of claim 5 wherein the dummy switch is prevented from passing signals other than off-state leakage signals by disabling the dummy switch only during on-state functioning of the primary switch.

9. The device of claim 5 wherein the primary and dummy switches are identically constructed, and each includes a differential pair of bipolar junction transistors.

10. The device of claim 5 wherein the differential switching device is included in a system-on-chip configuration and the primary current source is controllable by an on-chip control signal.

11. The device of claim 5 wherein the primary current source is controllable remotely by a control signal from an external control circuit.

12. The device of claim 5 wherein the differential switching device is included in a system-on-chip configuration and each of the primary current source and the dummy current source is controllable by an on-chip control signal.

13. The device of claim 5 wherein the dummy current source is always disabled.

14. The device of claim 5 wherein the differential switching device is included in a system-on-chip configuration.

15. The device of claim 5 wherein the differential switching device is included in a crossbar switch matrix.

16. An integrated circuit, comprising:
a differential input for receiving an analog differential input signal;
a primary switch coupled to the differential input and for receiving the analog differential input signal, the primary switch including a differential pair of transistors and the differential input being coupled to the bases or gates of those transistors, wherein in an enabled-state of the integrated circuit, the analog differential input signal is passed to a differential output of the primary switch, wherein in the enabled-state both transistors of the primary switch differential pair intentionally conduct at the same time at least part of the time but one transistor of the pair conducts more than the other transistor;
a dummy switch coupled to the differential input and for receiving the analog differential input signal, the dummy switch including a differential pair of transistors and the differential input being coupled to the bases or gates of those transistors, wherein in a disabled-state of the integrated circuit, off-state leakage current is cancelled at a differential output of the integrated circuit, by virtue of the differential output of the primary switch being coupled to the differential output of the integrated circuit and the dummy switch having its differential output reverse-coupled to the differential output of the primary switch;
a primary current source operatively coupled to the primary switch and set so that no intentional current flows through the primary switch during the disabled-state of the integrated circuit, wherein in the disabled-state neither transistor of the primary switch differential pair intentionally and
a dummy current source operatively coupled to the dummy switch and set so that no intentional current flows through the dummy switch during either of the enabled-state of the integrated circuit or the disabled-state of the integrated circuit, wherein neither transistor of the dummy switch differential pair intentionally conducts.

17. The integrated circuit of claim 16 wherein the dummy switch is prevented from passing signals other than off-state leakage signals by setting the dummy current source to zero.

18. The integrated circuit of claim 16 wherein the dummy switch is prevented from passing signals other than off-state leakage signals by disabling the dummy switch only during on-state functioning of the primary switch.

19. The integrated circuit of claim 16 wherein the dummy current source is always disabled.

20. The integrated circuit of claim 16 wherein the integrated circuit comprises a differential switching device that is included in a system-on-chip configuration.

* * * * *